(12) United States Patent
Yamauchi

(10) Patent No.: US 6,367,030 B1
(45) Date of Patent: Apr. 2, 2002

(54) ADDRESS CONVERSION CIRCUIT AND ADDRESS CONVERSION SYSTEM WITH REDUNDANCY DECISION CIRCUITRY

(75) Inventor: Hiroyuki Yamauchi, Takatsuki (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 0 days.

(21) Appl. No.: 09/168,183

(22) Filed: Oct. 7, 1998

(30) Foreign Application Priority Data

Oct. 9, 1997 (JP) .............................................. 9-277751

(51) Int. Cl.$^7$ ............................................. G06F 13/00
(52) U.S. Cl. .......................... 714/7; 365/200; 365/201; 714/711
(58) Field of Search ................................ 714/7, 6, 710, 714/711; 365/200, 201; 711/100, 201

(56) References Cited

U.S. PATENT DOCUMENTS

| | | | | |
|---|---|---|---|---|
| 4,691,281 A | * | 9/1987 | Furui ........................... | 710/72 |
| 5,237,553 A | * | 8/1993 | Fukushima et al. ........... | 369/58 |
| 5,357,473 A | * | 10/1994 | Mizuno et al. ............. | 365/201 |
| 5,392,246 A | * | 2/1995 | Akiyama et al. ........... | 365/200 |
| 5,742,934 A | * | 4/1998 | Shinohara ................... | 711/103 |
| 5,841,712 A | * | 11/1998 | Wendell et al. ............ | 365/200 |
| 5,862,314 A | * | 1/1999 | Jeddeloh ........................ | 714/8 |
| 6,052,767 A | * | 4/2000 | Matuki ....................... | 711/202 |
| 6,005,141 A | * | 5/2000 | Kitagawa ................... | 714/711 |
| 6,078,534 A | * | 6/2000 | Pfefferl et al. .............. | 365/200 |
| 6,128,684 A | * | 10/2000 | Okayama .................... | 710/109 |

FOREIGN PATENT DOCUMENTS

| | | |
|---|---|---|
| JP | 55045169 | 3/1980 |
| JP | 61058063 | 3/1986 |
| JP | 2-210697 | 8/1990 |
| JP | 6-325591 | 11/1994 |
| JP | 8-102186 | 4/1996 |

OTHER PUBLICATIONS

Japanese Office Action dated Sep. 9, 1999 for JP Application 10–287 129 and English Translation of Office Action.

* cited by examiner

*Primary Examiner*—Robert Beausoleil
*Assistant Examiner*—Raymond Phan
(74) *Attorney, Agent, or Firm*—Renner, Otto, Boisselle & Sklar

(57) ABSTRACT

An address conversion circuit is disclosed for converting a logical address to a physical address and outputting the physical address to a memory, the memory including a normal memory array and a redundant memory array wherein a defective address corresponding to a defective memory cell in the normal memory array is replaced by a redundant address in the redundant memory array so as to ensure total memory capacity of the memory. The address conversion circuit includes: an address conversion section for converting the logical address to a first physical address in the normal memory array and outputting the first physical address; a defective address storing section for storing the defective address corresponding to the defective memory cell in the memory; and a redundancy decision circuit for, in response to a decision that the first physical address matches the defective address, replacing the first physical address with a second physical address corresponding to the redundant address and sending the second physical address to the memory.

12 Claims, 8 Drawing Sheets

FIG. 3

Address conversion algorithm (a) Aphys. = Alogic − 8888; (Logical address to physical address conversion)

(b)
If Aphys. < 2220 then Ared.phys. = Aphys. , else,
If Aphys. ∈ (2221, 2222) then Ared.phys. = R0, else, Ared.phys. = R1,
If Aphys. = 2221 then Ared.phys. = R0, else, Ared.phys. = R1,
If Aphys. ∈ (5551, 5552) then Ared.phys. = R2, else, Ared.phys. = R3,
If Aphys. = 5551 then Ared.phys. = R2, else, Ared.phys. = R3,

ADDRESS CONVERSION CIRCUIT AND ADDRESS CONVERSION SYSTEM WITH REDUNDANCY DECISION CIRCUITRY

BACKGROUND OF THE INVENTION

1. Field of the Invention

The present invention relates to an address conversion circuit and an address conversion system. More particularly, the present invention relates to an address conversion circuit and an address conversion system for use with a memory which is provided with a redundant memory array for relieving defective memory cells so as to facilitate ensuring memory capacity.

2. Description of the Related Art

FIG. 6 illustrates a conventional address conversion system. The address conversion system includes a CPU 3, a memory control circuit 110 connected to the CPU 3, and a plurality of memories 102 connected to the memory control circuit 110.

Memory is sold typically with a particular capacity (eg. 40 MB). This capacity is ensured, meaning that even if some memory cells are defective, the memory will still provide the designated capacity.

Each memory 102 includes a normal memory array (not shown) having a capacity corresponding to the total capacity of the memory 102.

The memory 102 of the conventional address conversion system includes, in addition to the normal memory array, a redundant memory array (not shown) and a redundancy decision circuit 103 for ensuring the total capacity of the memory 102 even when the normal memory array includes a defective memory cell (not shown). When the defective memory cell is to be accessed, the redundancy decision circuit 103 replaces a physical address corresponding to the defective memory cell by another physical address corresponding to a memory cell in the redundant memory array.

FIG. 7 illustrates the memory 102 and the memory control circuit 110 of the conventional address conversion system in greater detail. For sake of simplicity, only one memory 102 is shown in FIG. 7. The memory control circuit 110 includes an address conversion section 101. The redundancy decision circuit 103 in the memory 102 includes a comparison circuit 102A and a defective address storing section 102B.

The address conversion circuit 101 converts a logical address received from the CPU 3 to a physical address corresponding to a memory cell in the memory 102. The comparison circuit 102A compares the physical address received from the address conversion circuit 101 with a defective address stored in the defective address storing section 102B.

When the physical address received from the address conversion circuit 101 matches the defective address, the memory cell to be accessed is a defective memory cell. In such a case, the redundancy decision circuit 103 replaces the physical address received from the address conversion circuit 101 by a redundant address corresponding to a memory cell in the redundant memory array and accesses the memory cell in the redundant memory array instead of the defective memory cell.

When the physical address received from the address conversion circuit 101 does not match the defective address, the memory cell to be accessed is a normal memory cell. In such a case, the redundancy decision circuit 103 accesses the memory cell in the normal memory array corresponding to the physical address received from the address conversion circuit 101.

As described above, the conventional address conversion system includes the redundancy decision circuit 103 in each memory 102 so that the redundancy decision is made within the memory 102 for ensuring the total capacity of the memories 102 even when a defective memory cell exists. In such an address conversion system, however, the access speed to the memory decreases for the reason described below.

FIG. 8A illustrates a first processing method used in a memory access operation by the conventional address conversion system. FIG. 8B illustrates a second processing method used in a memory access operation by the conventional address conversion system.

Referring to FIG. 8A, in the first processing method, the redundancy decision circuit 103 first performs a process P1 (over a time period T1) for determining whether a physical address received from the address conversion circuit 101 matches a defective address stored in the defective address storing section 102B and, if there is a match, replacing the physical address with a redundant address. Subsequent to the process P1, a process P2 (over a time period T2) is performed for accessing a memory cell corresponding to either the physical address from the address conversion circuit 101 (a normal address) or the redundant address by which the physical address from the address conversion circuit 101 is replaced.

Referring to FIG. 8B, in the second processing method, the process P1 is performed as described above while performing, in parallel with the process P1, a process P3 (over a time period T3) for making an access to a certain point in an access path to the memory cell corresponding to the normal address.

Subsequent to the process P1, if the redundancy decision circuit 103 in the memory 102 determines that the physical address received from the address conversion circuit 101 matches the defective address, a process P4 (over the time period T2) is performed to access the memory cell corresponding to the redundant address with which the physical address from the address conversion circuit 101 is replaced.

If the redundancy decision circuit 103 determines that the physical address received from the address conversion circuit 101 does not match the defective address, the redundancy decision circuit 103 does not have to perform the address replacement process. In such a case, after a wait time T5 (=T1−T3), a process P6 (over a time period T6=T2−T3) is performed to complete access to the normal address part of which has been made during the process P3.

In either the first processing method or the second processing method, the accessing time (a time period from the time when the memory 102 receives a physical address to the time when the addressed data is accessed and output) necessarily includes the time period T1 (for the redundancy decision circuit 103 to determine whether the physical address received from the address conversion circuit 101 matches a defective address and, if there is a match, replace the physical address by a redundant address).

Conventionally, in order to meet the demand to design a memory such that the memory independently ensures the total capacity thereof, the redundancy decision circuit 103 has been provided in the memory 102. As a result, the time period T1 (for determining whether the physical address received from the address conversion circuit 101 matches a defective address and, if there is a match, replacing the physical address by a redundant address) has been consumed by the memory 102. This is disadvantageous, however, in terms of reducing the time required by the address conversion system to access the memory 102.

SUMMARY OF THE INVENTION

According to one aspect of this invention, an address conversion circuit is provided for converting a logical address to a physical address and outputting the physical address to a memory, the memory including a normal memory array and a redundant memory array wherein a defective address corresponding to a defective memory cell in the normal memory array is replaced by a redundant address in the redundant memory array so as to ensure total memory capacity of the memory. The address conversion circuit includes: an address conversion section for converting the logical address to a first physical address in the normal memory array and outputting the first physical address; a defective address storing section for storing the defective address corresponding to the defective memory cell in the memory; and a redundancy decision circuit for, in response to a decision that the first physical address matches the defective address, replacing the first physical address with a second physical address corresponding to the redundant address and sending the second physical address to the memory.

In one embodiment of the invention, the redundancy decision circuit includes: a comparison section for comparing the first physical address output from the address conversion section with a defective address stored in the defective address storing section and outputting a comparison result; a replacement section for replacing the first physical address in the normal memory array by the second physical address corresponding to the redundant address; and a selector for selectively outputting to the memory one of the first and second physical addresses based on the comparison result.

In one embodiment of the invention, the redundancy decision circuit includes a mode signal output section for outputting a mode signal to the memory based on the comparison result.

According to another aspect of this invention, an address conversion system includes: a CPU for outputting a logical address; an address conversion circuit for receiving the logical address, converting the logical address to a physical address and outputting the physical address; and a memory for receiving the physical address and accessing a memory cell corresponding to the physical address. The memory includes a normal memory array and a redundant memory array wherein a defective address corresponding to a defective memory cell in the normal memory array is replaced by a redundant address in the redundant memory array so as to ensure total memory capacity of the memory. The address conversion circuit includes: an address conversion section for converting the logical address to a first physical address in the normal memory array and outputting the first physical address; a defective address storing section for storing the defective address corresponding to the defective memory cell in the memory; and a redundancy decision circuit for, in response to a decision that the first physical address matches the defective address, replacing the first physical address by a second physical address corresponding to the redundant address and sending the second physical address to the memory.

In one embodiment of the invention, the redundancy decision circuit includes: a comparison section for comparing the first physical address output from the address conversion section with a defective address stored in the defective address storing section and outputting a comparison result; a replacement section for replacing the first physical address in the normal memory array by the second physical address corresponding to the redundant address; and a selector for selectively outputting to the memory one of the first and second physical addresses based on the comparison result.

In one embodiment of the invention, the address conversion circuit further includes a mode signal output section for outputting a mode signal to the memory based on the comparison result.

In one embodiment of the invention, the memory includes a plurality of memory chips.

When a defective memory cell is to be accessed, the address conversion circuit of the present invention replaces the physical address corresponding to the defective memory cell by another physical address corresponding to a memory cell in a redundant memory array, and outputs the redundant address to the memory.

Thus, when using the address conversion circuit of the present invention, the time period consumed for determining whether a received physical address matches a defective address and, if there is a match, replacing the physical address by a redundant address is not included in the accessing time (a time period from the time when the memory receives a physical address to the time when the addressed data is accessed and output).

As a result, it is possible to reduce the time required to access the memory while ensuring total capacity of the memory even when a defective memory cell exists in the memory.

Thus, the invention described herein makes possible the advantages of (1) providing an address conversion circuit which can reduce the time required to access a memory while ensuring total memory capacity even when a defective memory cell exists in the memory; and (2) providing an address conversion system incorporating such an address conversion circuit.

These and other advantages of the present invention will become apparent to those skilled in the art upon reading and understanding the following detailed description with reference to the accompanying figures.

BRIEF DESCRIPTION OF THE DRAWINGS

FIG. 3 shows an exemplary address conversion algorithm for use with the address conversion system of FIG. 1;

DESCRIPTION OF THE PREFERRED EMBODIMENTS

An address conversion system according to an example of the present invention will now be described.

Figure 1:
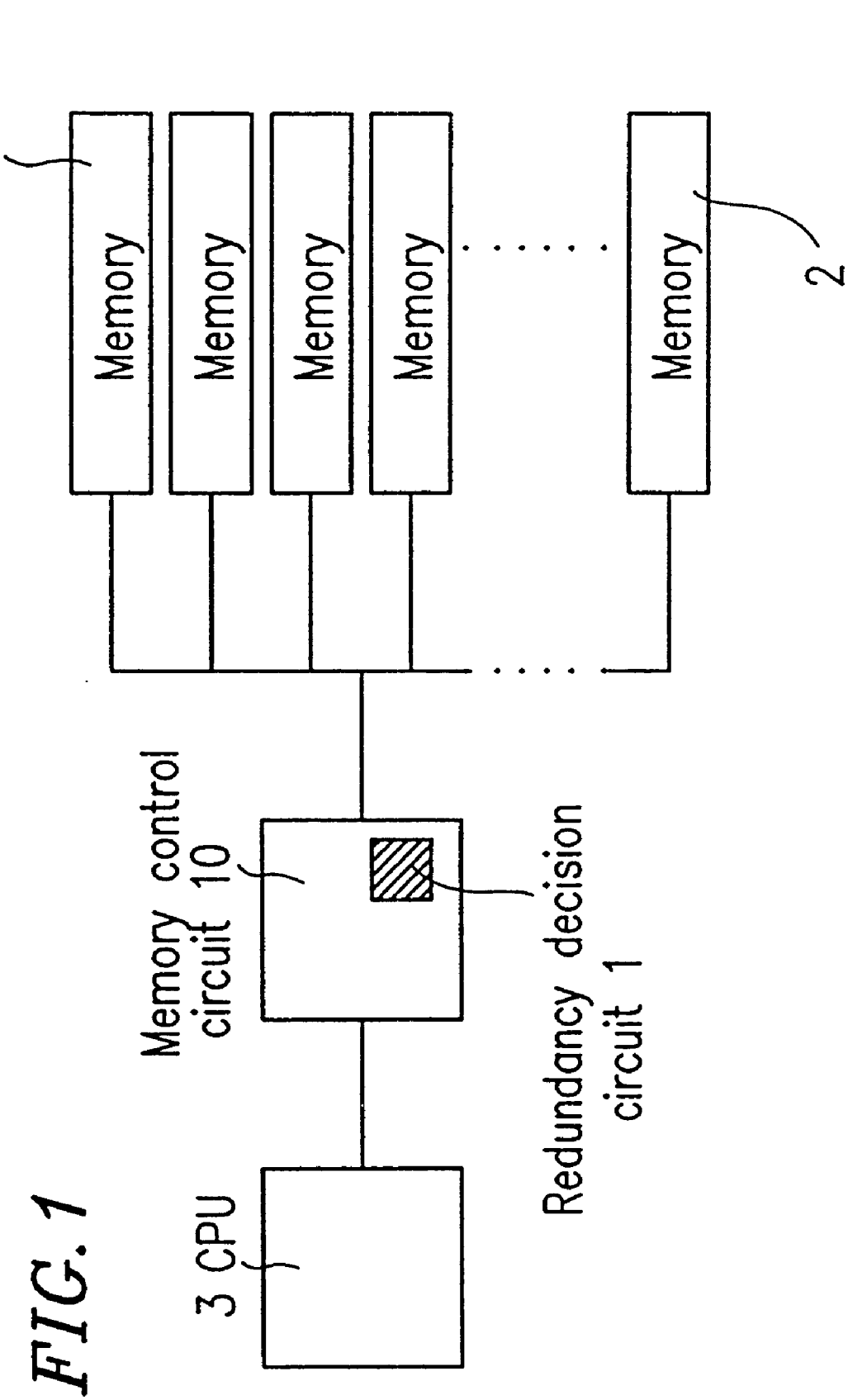
FIG. 1 illustrates an address conversion system according to an example of the present invention.

FIG. 1 illustrates the address conversion system according to the example of the present invention. The address conversion system includes the CPU 3, a memory control circuit 10 connected to the CPU 3, and a plurality of memories 2 connected to the memory control circuit 10. The memory control circuit 10 includes a redundancy decision circuit 1. When a defective memory cell (not shown) is to be accessed, the redundancy decision circuit 1 replaces the physical address corresponding to the defective memory cell by another physical address corresponding to a memory cell in a redundant memory array (not shown).

Figure 2:
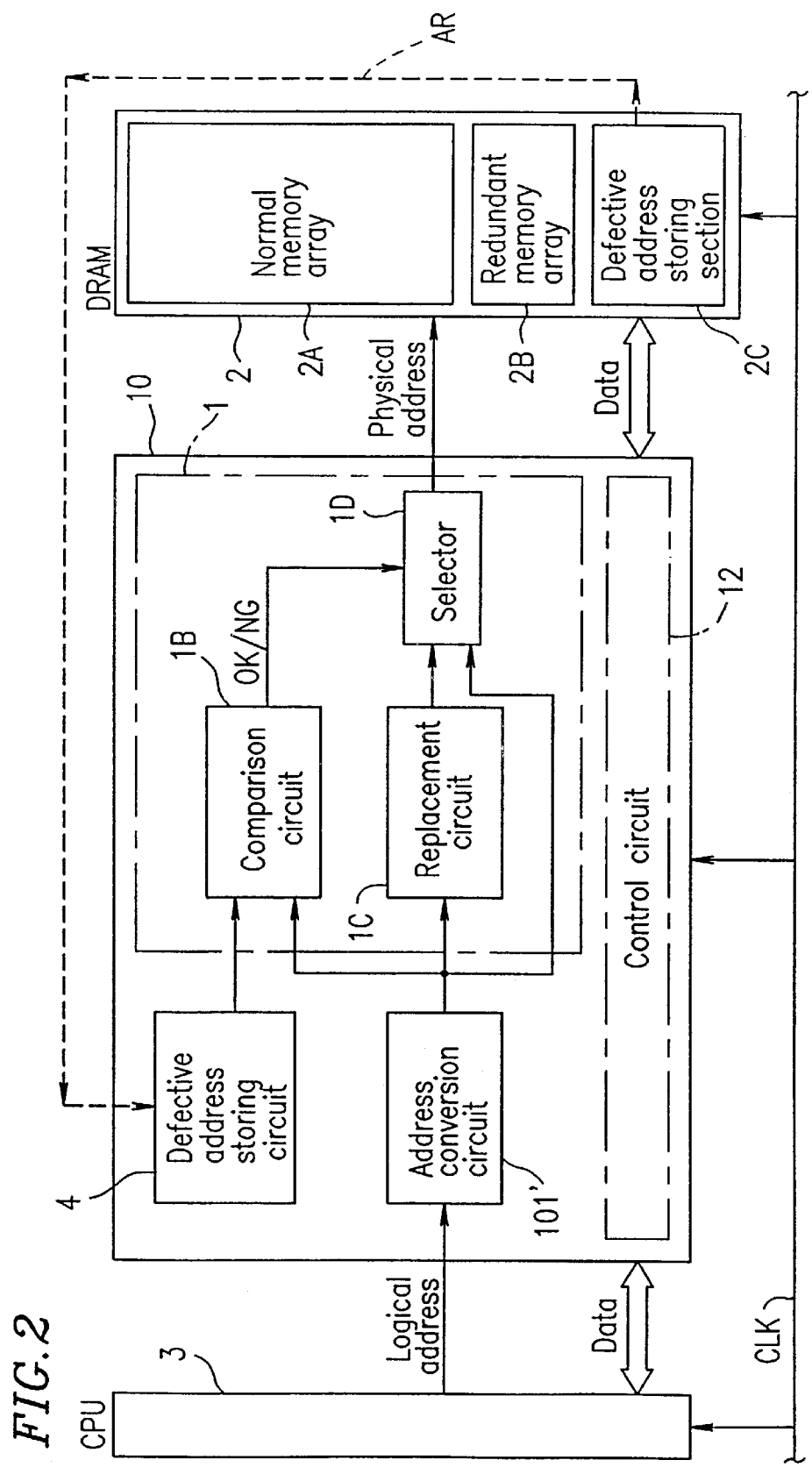
FIG. 2 illustrates a memory control circuit and a memory of the address conversion system of FIG. 1.

FIG. 2 illustrates the memory control circuit 10 and the memory 2 of the address conversion system in greater detail. FIG. 3 shows an exemplary address conversion algorithm for use with the address conversion system of the present invention.

Referring to FIG. 2, the memory control circuit 10 includes the redundancy decision circuit 1, an address conversion circuit 101', a defective address storing circuit 4 and a control circuit 12. The redundancy decision circuit 1 includes a comparison circuit 1B, a replacement circuit 1C and a selector 1D. The memory 2 includes a normal memory array 2A, a redundant memory array 2B and a defective address storing section 2C. The CPU 3, the memory control circuit 10 and the memory 2 are connected to a clock signal line CLK.

The normal memory array 2A includes normal memory cells having a capacity corresponding to the total capacity specification of the memory 2. The redundant memory array 2B includes redundant memory cells for replacing defective memory cells which may exist in the normal memory array 2A, in order to ensure total memory capacity.

When the address conversion circuit 101' receives a logic address from the CPU 3, the address conversion circuit 101' converts the logic address to a physical address in the normal memory array 2A and outputs the physical address. This address conversion process is performed based on the address conversion algorithm shown in FIG. 3.

The comparison circuit 1B compares the physical address output by the address conversion circuit 101' with a defective address stored in the defective address storing circuit 4, and outputs the comparison result. The replacement circuit 1C replaces the physical address output by the address conversion circuit 101' by another physical address representing a redundant address corresponding to a memory cell in the redundant memory array 2B.

When the comparison result output by the comparison circuit 1B indicates that there is a match, the selector 1D selects and outputs the physical address representing the redundant address output by the replacement circuit 1C to the memory 2. When the comparison result output by the comparison circuit 1B indicates that there is no match, the Selector 1D selects and outputs the physical address in the normal memory array 2A output by the address conversion circuit 101' to the memory 2.

Based on the physical address from the selector 1D, the memory 2 accesses either the normal memory array 2A or the redundant memory array 2B.

Figure 4:
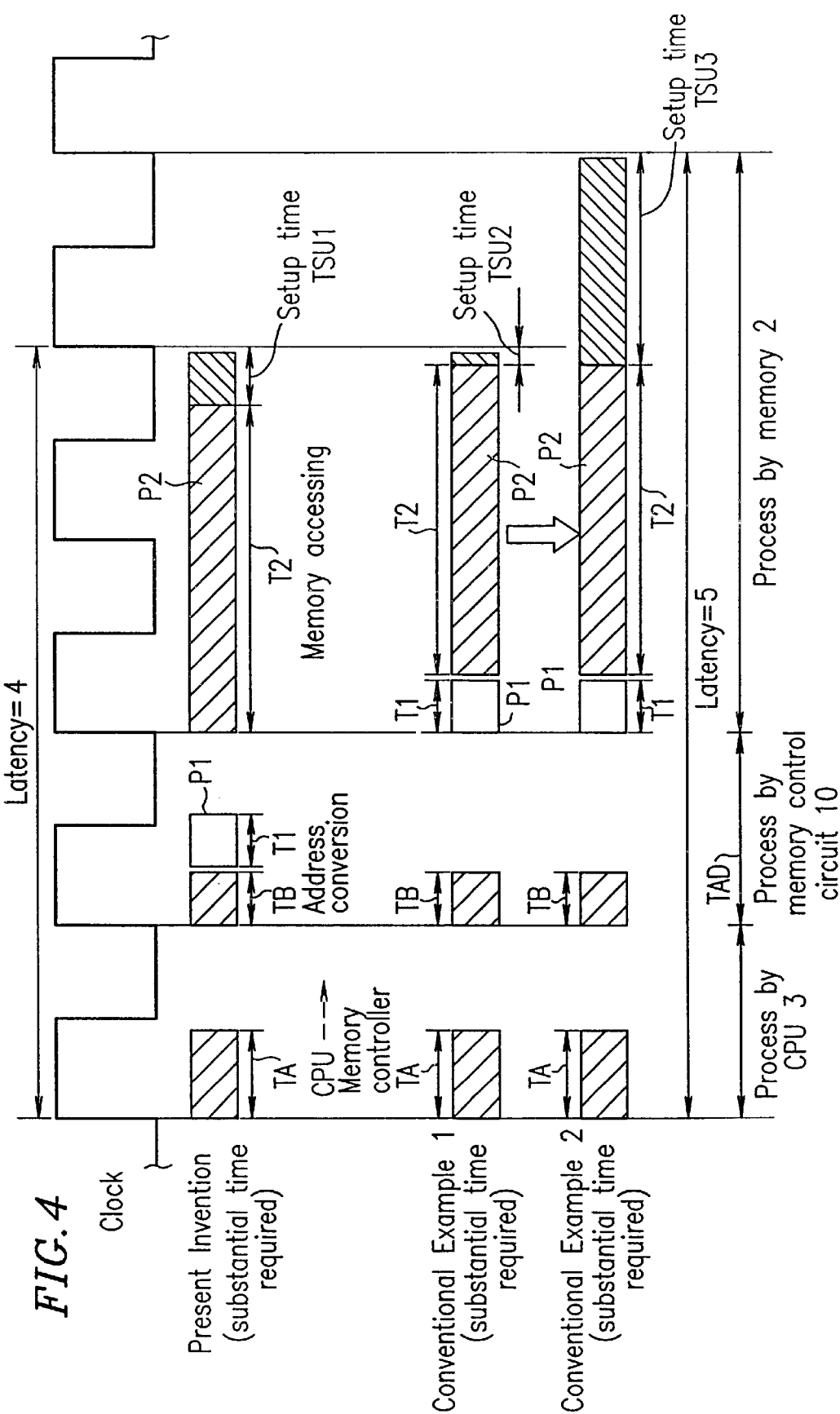
FIG. 4 is a timing diagram illustrating a memory access operation performed by the address conversion system of FIG. 1.

FIG. 4 is a timing diagram illustrating an operation of the address conversion system of the present invention.

The CPU 3 and the memory control circuit 10 operate in synchronization with a clock signal provided through the clock signal line CLK. Recently, in some systems, the access operation by the memory 2 is also in synchronization with the clock signal provided through the clock signal line CLK. A significant factor in such a clock synchronization type address conversion system is "setup time". The term "setup time" as used herein and illustrated in FIG. 4 refers to a length of time allowed before a rising edge of the next clock signal pulse after accessed data is obtained. While respective processes performed by the CPU 3, the memory control circuit 10 and the memory 2 each have a certain setup time, the process by the memory 2 has the least setup time. Therefore, it is desirable to increase the setup time in the process by the memory 2.

As shown in "Conventional Example 1" in FIG. 4, in the conventional address conversion system, the process P1 (consuming time period T1) is performed as part of the process by the memory 2.

The process P2 consumes time period T2 in making an access based on either a normal address or a redundant address (e.g., receiving an address sent from the address conversion circuit 101'; pre-decoding the received address; and selecting a word line and a column line).

When the memory 2 is assigned with the process P1 in addition to the process P2, the resulting setup time TSU2 is very short as shown in FIG. 3. Thus, there is not sufficient time for the accessing process performed by the memory 2.

In order to provide a sufficient setup time TSU3 as shown in "Conventional Example 2" in FIG. 4, the end of the accessing process is necessarily delayed by one clock. As a result, a latency of 5 clocks is required for the process which is supposed to require a latency of only 4 clocks. Thus, the access speed of the memory 2 decreases when the process P1 is assigned to the memory 2, and the memory 2 is responsible for ensuring the total memory capacity.

Looking over the entire address conversion system, however, a sufficient time for the accessing process can be found in the process by the memory control circuit 10. A 1-clock time period TAD is assigned to the process by the memory control circuit 10. The time period TAD is sufficient to additionally accommodate the process P1 (for comparing a received physical address with a defective address and, if there is a match, replacing the physical address by a redundant address).

Figure 8A:
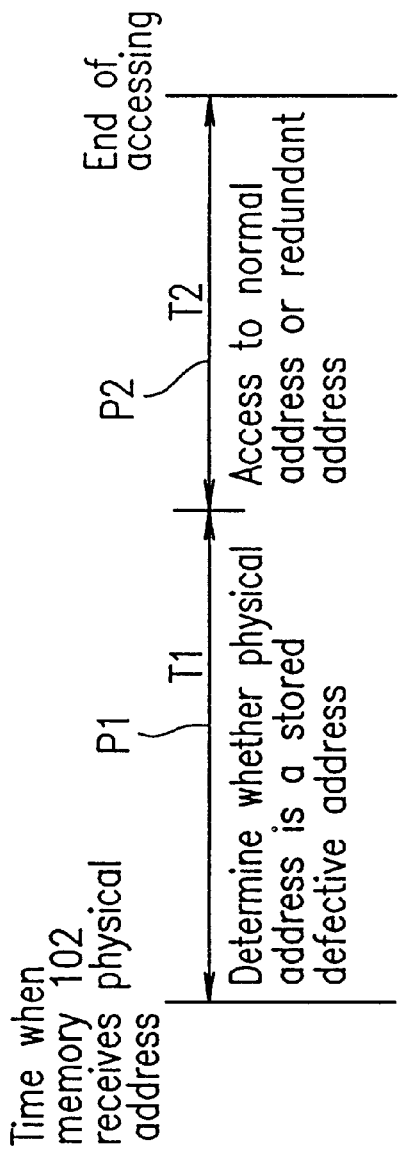
FIG. 8A illustrates a first processing method used by the conventional address conversion system for performing a memory access operation.
Figure 8B:
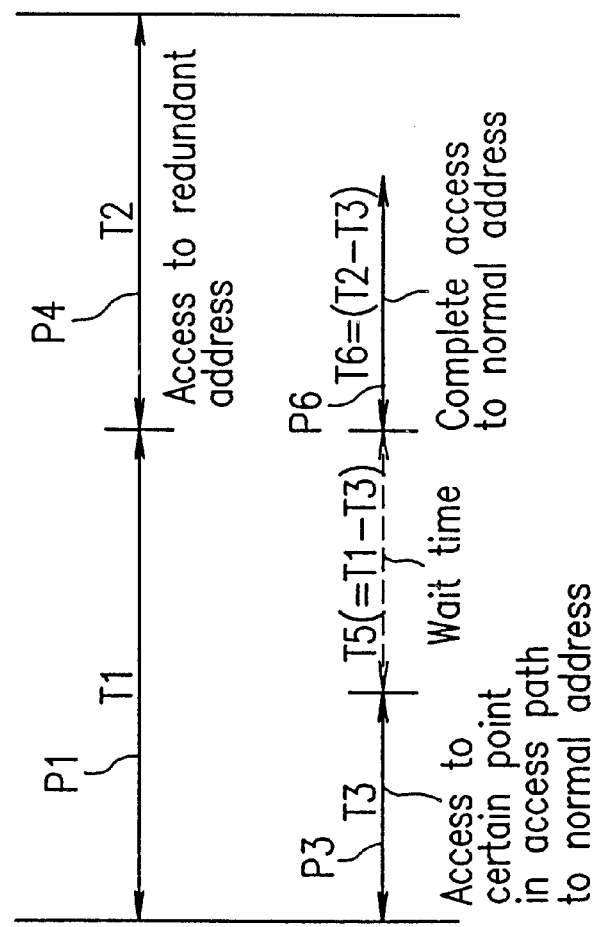
FIG. 8B illustrates a second processing method used by the conventional address conversion system for performing a memory access operation.

Thus, in the address conversion system of the present invention, the process P1 is assigned as part of the time period TAD. In other words, the time period T1 as defined in the first and second conventional process methods (FIGS. 8A and 8B) is assigned as part of the time period TAD. As a result, the memory is afforded sufficient time for the accessing process, and the total access time is reduced as compared to the conventional systems.

Figure 5:
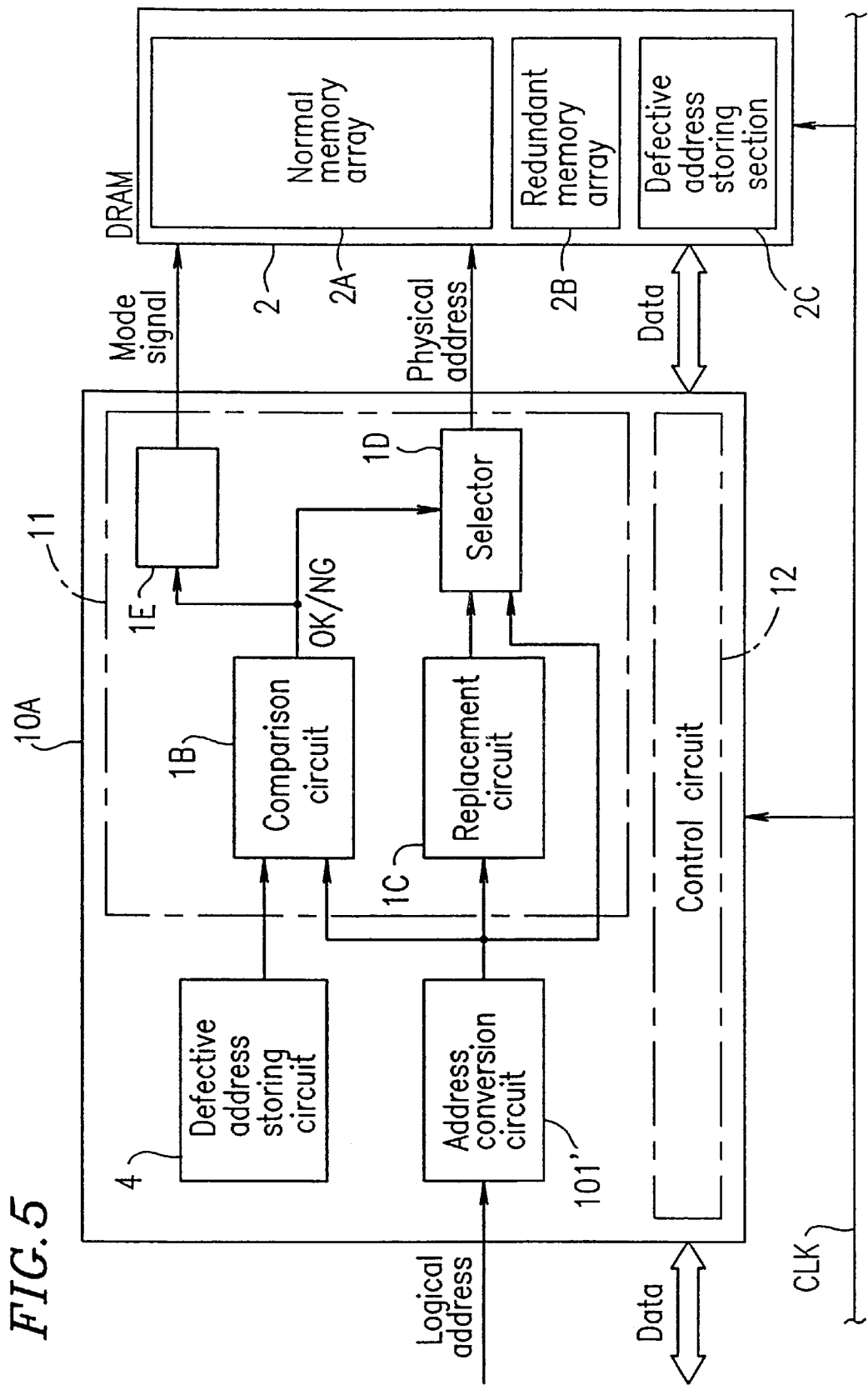
FIG. 5 illustrates a memory control circuit and a memory of an address conversion system according to a variation of the present invention.
Figure 6:
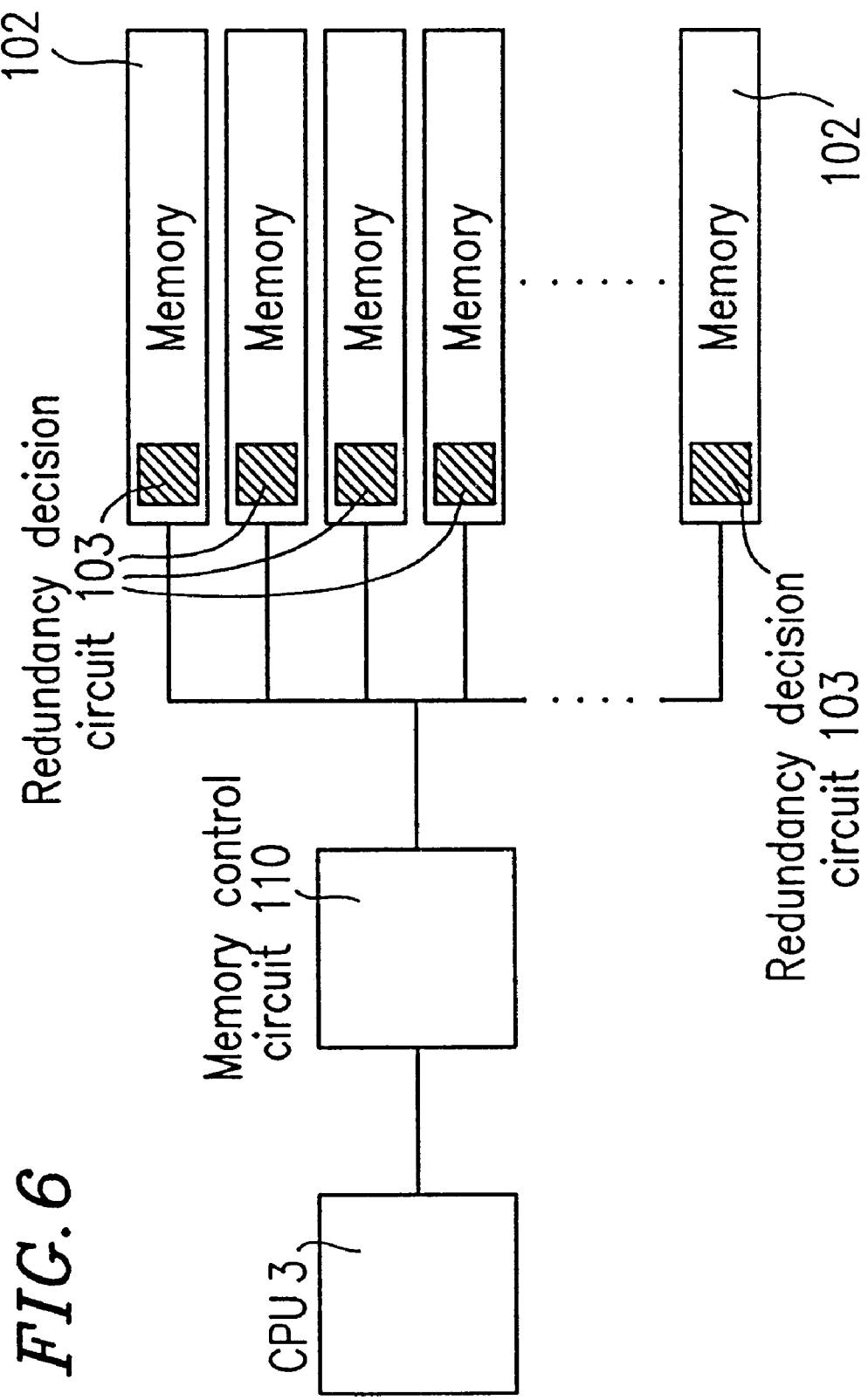
FIG. 6 illustrates a conventional address conversion system.
Figure 7:
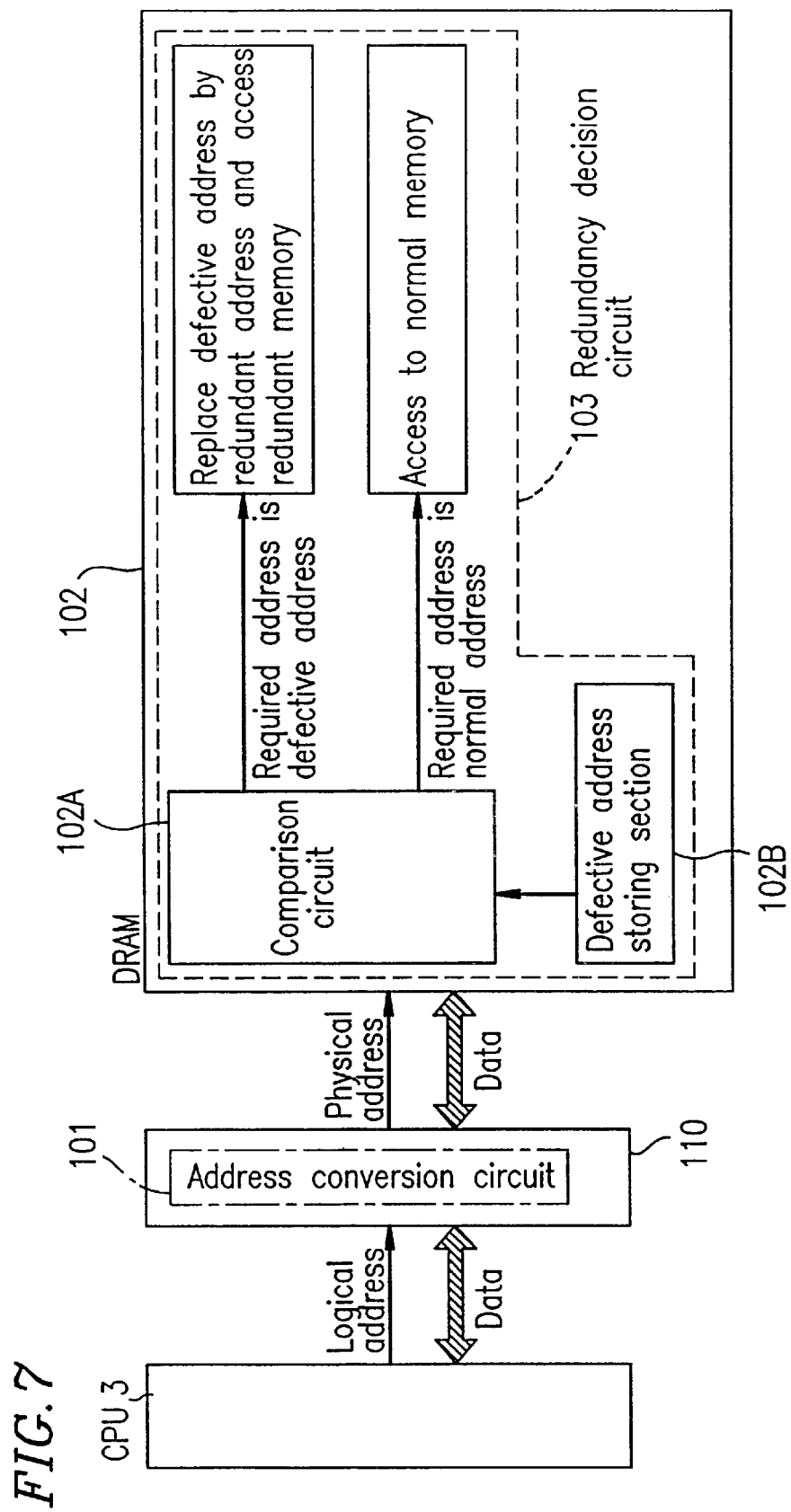
FIG. 7 illustrates a memory and a memory control circuit of the conventional address conversion system.

FIG. 5 illustrates a memory control circuit 10A and the memory 2 of another address conversion system according to a variation of the present example of the invention. In FIG. 5, elements which have been already presented in FIG. 2 are provided with the same reference numerals, and those elements will not be further described below.

A difference from the address conversion system illustrated in FIG. 2 is that a mode signal output circuit 1E is provided in a redundancy decision circuit 11. The memory control circuit 10A includes the redundancy decision circuit 11, the address conversion circuit 101', the defective address storing circuit 4 and the control circuit 12. The redundancy decision circuit 11 includes the comparison circuit 1B, the replacement circuit 1C, the selector 1D and the mode signal output circuit 1E.

When the comparison result output by the comparison circuit 1B indicates that there is a match, the mode signal output circuit 1E sends a mode signal to the memory 2 indicating access to the redundant memory array 2B. When the comparison result output by the comparison circuit 1B indicates that there is no match, the mode signal output circuit 1E sends a different mode signal to the memory 2 indicating access to the normal memory array 2A.

Since the normal memory array 2A and the redundant memory array 2B are structurally different from each other, different addressing methods should preferably be used for the respective memory arrays. The redundant memory array 2B typically has small capacity. If the redundant memory array 2B has 16 redundant memory cells, for example, an address bit length of 4 is used for addressing the redundant memory array 2B. Generally, the address bit length used for addressing the redundant memory array 2B is less than that used for addressing the normal memory array 2A. Thus, different addressing methods are used for the normal memory array 2A and the redundant memory array 2B, respectively.

When the memory 2 receives a mode signal indicating access to the redundant memory array 2B, the memory 2 accesses the redundant memory array 2B based on an addressing method suitable for the redundant memory array 2B. Similarly, when the memory 2 receives a mode signal indicating access to the normal memory array 2A, the memory 2 accesses the normal memory array 2A based on another addressing method suitable for the normal memory array 2A. Thus, based on the mode signal, the memory 2 can determine whether a physical address received from the selector 1D is an address in the normal memory array 2A or is an address in the redundant memory array 2B.

A method for storing a defective address in the defective address storing circuit 4 will now be described. A defective address in the memory 2 is first stored in the defective address storing section 2C which is a non-volatile memory device provided in the memory 2. Thereafter, the defective address is read out from the defective address storing section 2C and then stored in the defective address storing circuit 4, as indicated by an arrow AR (FIG. 2). For example, a defective address can be stored in the defective address storing section 2C before the shipping of the memory 2, and the defective address can be transferred from the defective address storing section 2C to the defective address storing circuit 4 after mounting the memory 2 in the address conversion system.

Defects causing defective addresses include a point bit defect as well as continuous defects such as a word line defect and a bit line defect where the resulting defective addresses are continuous. It is possible to store the continuous defective addresses caused by a continuous defect one by one in the defective address storing circuit 4 or the defective address storing section 2C. Alternatively, each set of continuous addresses having some common upper bits for each row or column can collectively be stored as defective addresses.

Moreover, the redundancy decision circuit 1 can further include a test circuit for determining whether an address in the memory 2 is a defective address and, if it is, storing the defective address in the defective address storing circuit 4. In such a case, it is possible to relieve not only the defective addresses which have been stored before the shipping of the memory 2, but also other defective addresses newly found after the memory 2 is mounted in the address conversion system.

As described above, the address conversion system of the present invention reduces time required to access a memory while ensuring total capacity of the memory even when a defective memory cell exists in the memory.

In the address conversion system according to the illustrated example of the present invention, only one redundancy decision circuit is provided in the memory control circuit. Therefore, it is possible to reduce the area and cost of the memory 2 from those in the conventional address conversion system where the redundancy decision circuit is provided for each of the plurality of memories.

In the address conversion system according to the illustrated example of the present invention, before an access request is sent to the memory 2, the redundancy decision circuit determines whether the requested physical address is a normal address or a redundant address. Therefore, the memory 2 does not have to operate respective circuits for accessing the normal address and for accessing the redundant address. When the requested physical address is a normal address, the memory 2 can operate only one circuit for accessing the normal address. When the requested physical address is a redundant address, the memory 2 can also operate only one circuit for accessing the redundant address. As a result, the power consumption of the address conversion system can be reduced from that of the conventional address conversion system which is required to operate both of such circuits.

In the above-described example, the memory 2 is a synchronous type memory which operates in synchronization with a clock signal, but the present invention is not limited thereto For example, the memory 2 may alternatively be a non-synchronous type memory.

Moreover, in the above-described example, the redundancy decision circuit is provided in the memory control circuit, but the present invention is not limited thereto. For example, the redundancy decision circuit may alternatively be a circuit separate from the memory control circuit.

As described above, when a defective memory cell is to be accessed, the address conversion circuit of the present invention replaces the physical address corresponding to the defective memory cell by another physical address corresponding to a memory cell in the redundant memory array, and outputs the redundant address.

Thus, the memory does not require the time period for determining whether the received physical address matches a defective address and, if there is a match, replacing the received physical address by a redundant address.

As a result, it is possible to reduce the time required to access a memory while ensuring total capacity of the memory even when a defective memory cell exists in the memory.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An address conversion circuit for converting a logical address to a physical address and outputting the physical address to a memory chip, the memory chip including a normal memory array and a redundant memory array wherein a defective address corresponding to a defective memory cell in the normal memory array is replaced by a redundant address in the redundant memory array so as to ensure total memory capacity of the memory chip, the address conversion circuit comprising:

an address conversion section for converting the logical address to a first physical address in the normal memory array and outputting the first physical address;

a defective address storing section for storing the defective address corresponding to the defective memory cell in the memory chip; and a redundancy decision circuit for, in response to a decision that the first physical address matches the defective address, replacing the first physical address with a second physical address corresponding to the redundant address and sending the second physical address to the memory chip.

2. An address conversion circuit according to claim 1, wherein the redundancy decision circuit comprises:

a comparison section for comparing the first physical address output from the address conversion section with a defective address stored in the defective address storing section and outputting a comparison result;

a replacement section for replacing the first physical address in the normal memory array by the second physical address corresponding to the redundant address; and a selector for selectively outputting to the memory chip one of the first and second physical addresses based on the comparison result.

3. An address conversion circuit according to claim 1, wherein the redundancy decision circuit comprises:

a comparison section for comparing the first physical address output from the address conversion section with a defective address stored in the defective address storing section and outputting a comparison result; and a mode signal output section for outputting a mode signal to the memory chip based on the comparison result.

4. An address conversion system, comprising:

a CPU for outputting a logical address;

an address conversion circuit for receiving the logical address, converting the logical address to a physical address and outputting the physical address; and a memory chip for receiving the physical address and accessing a memory cell corresponding to the physical address, wherein:

the memory chip comprises a normal memory array and a redundant memory array wherein a defective address corresponding to a defective memory cell in the normal memory array is replaced by a redundant address in the redundant memory array so as to ensure total memory capacity of the memory chip; and the address conversion circuit comprises:

an address conversion section for converting the logical address to a first physical address in the normal memory array and outputting the first physical address;

a defective address storing section for storing the defective address corresponding to the defective memory cell in the memory chip; and a redundancy decision circuit for, in response to a decision that the first physical address matches the defective address, replacing the first physical address by a second physical address corresponding to the redundant address and sending the second physical address to the memory chip.

5. An address conversion system according to claim 4, wherein the redundancy decision circuit comprises:

a comparison section for comparing the first physical address output from the address conversion section with a defective address stored in the defective address storing section and outputting a comparison result;

a replacement section for replacing the first physical address in the normal memory array by the second physical address corresponding to the redundant address; and a selector for selectively outputting to the memory chip one of the first and second physical addresses based on the comparison result.

6. An address conversion system according to claim 4, wherein the address conversion circuit further comprises:

a comparison section for comparing the first physical address output from the address conversion section with a defective address stored in the defective address storing section and outputting a comparison result; and a mode signal output section for outputting a mode signal to the memory chip based on the comparison result.

7. An address conversion system according to claim 4, wherein the memory chip is one of a plurality of memory chips.

8. An address conversion circuit for converting a logical address to a physical address and outputting the physical address to a memory, the memory including a normal memory array and a redundant memory array wherein a defective address corresponding to a defective memory cell in the normal memory array is replaced by a redundant address in the redundant memory array so as to ensure total memory capacity of the memory, the address conversion circuit comprising:

an address conversion section for converting the logical address to a first physical address in the normal memory array and outputting the first physical address;

a defective address storing section for storing the defective address corresponding to the defective memory cell in the memory; and a redundancy decision circuit for, in response to a decision that the first physical address matches the defective address, replacing the first physical address with a second physical address corresponding to the redundant address and sending the second physical address to the memory, wherein the redundancy decision circuit comprises:

a comparison section for comparing the first physical address output from the address conversion section with a defective address stored in the defective address storing section and outputting a comparison result;

a replacement section for replacing the first physical address in the normal memory array by the second physical address corresponding to the redundant address; and a selector for selectively outputting to the memory one of the first and second physical addresses based on the comparison result.

9. An address conversion circuit for converting a logical address to a physical address and outputting the physical address to a memory, the memory including a normal memory array and a redundant memory array wherein a defective address corresponding to a defective memory cell in the normal memory array is replaced by a redundant address in the redundant memory array so as to ensure total memory capacity of the memory, the address conversion circuit comprising:

an address conversion section for converting the logical address to a first physical address in the normal memory array and outputting the first physical address;

a defective address storing section for storing the defective address corresponding to the defective memory cell in the memory;

a redundancy decision circuit for, in response to a decision that the first physical address matches the defective address, replacing the first physical address with a second physical address corresponding to the redundant address and sending the second physical address to the memory; and a comparison section for comparing the first physical address output from the address conversion section with a defective address stored in the defective address storing section and outputting a comparison result, wherein the redundancy decision circuit comprises a mode signal output section for outputting a mode signal to the memory based on the comparison result.

10. An address conversion system, comprising:

a CPU for outputting a logical address;

an address conversion circuit for receiving the logical address, converting the logical address to a physical address and outputting the physical address; and a memory for receiving the physical address and accessing a memory cell corresponding to the physical address, wherein:

the memory comprises a normal memory array and a redundant memory array wherein a defective address corresponding to a defective memory cell in the normal memory array is replaced by a redundant address in the redundant memory array so as to ensure total memory capacity of the memory; and the address conversion circuit comprises:

an address conversion section for converting the logical address to a first physical address in the normal memory array and outputting the first physical address;

a defective address storing section for storing the defective address corresponding to the defective memory cell in the memory; and a redundancy decision circuit for, in response to a decision that the first physical address matches the defective address, replacing the first physical address by a second physical address corresponding to the redundant address and sending the second physical address to the memory, wherein the redundancy decision circuit comprises:

a comparison section for comparing the first physical address output from the address conversion section with a defective address stored in the defective address storing section and outputting a comparison result;

a replacement section for replacing the first physical address in the normal memory array by the second physical address corresponding to the redundant address; and a selector for selectively outputting to the memory one of the first and second physical addresses based on the comparison result.

11. An address conversion system, comprising:

a CPU for outputting a logical address;

an address conversion circuit for receiving the logical address, converting the logical address to a physical address and outputting the physical address; and a memory for receiving the physical address and accessing a memory cell corresponding to the physical address, wherein:

the memory comprises a normal memory array and a redundant memory array wherein a defective address corresponding to a defective memory cell in the normal memory array is replaced by a redundant address in the redundant memory array so as to ensure total memory capacity of the memory; and the address conversion circuit comprises:

an address conversion section for converting the logical address to a first physical address in the normal memory array and outputting the first physical address;

a defective address storing section for storing the defective address corresponding to the defective memory cell in the memory;

a redundancy decision circuit for, in response to a decision that the first physical address matches the defective address, replacing the first physical address by a second physical address corresponding to the redundant address and sending the second physical address to the memory; and a comparison section for comparing the first physical address output from the address conversion section with a defective address stored in the defective address storing section and outputting a comparison result;

wherein the address conversion circuit further comprises a mode signal output section for outputting a mode signal to the memory based on the comparison result.

12. An address conversion circuit according to claim 1, wherein the memory chip is one of a plurality of memory chips.

* * * * *